United States Patent
Lee et al.

(10) Patent No.: US 7,848,064 B2
(45) Date of Patent: *Dec. 7, 2010

(54) ENHANCED ANTI-PARALLEL-PINNED SENSOR USING THIN RUTHENIUM SPACER AND HIGH MAGNETIC FIELD ANNEALING

(75) Inventors: Wen-Yaung Lee, San Jose, CA (US); Jinshan Li, San Jose, CA (US); Daniele Mauri, San Jose, CA (US); Koichi Nishioka, Kanagawa-ken (JP); Yasunari Tajima, Kanagawa-ken (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/172,134

(22) Filed: Jul. 11, 2008

(65) Prior Publication Data

US 2008/0285182 A1    Nov. 20, 2008

Related U.S. Application Data

(63) Continuation of application No. 11/048,406, filed on Feb. 1, 2005, now Pat. No. 7,408,747.

(51) Int. Cl.
    *G11B 5/39* (2006.01)
(52) U.S. Cl. ............................ 360/324.11; 428/811.2
(58) Field of Classification Search ............... 360/324, 360/324.1, 324.11, 324.12, 324.2; 428/811.2; 324/252; 338/32 R
See application file for complete search history.

(56) References Cited

U.S. PATENT DOCUMENTS

| | | | | |
|---|---|---|---|---|
| 6,592,725 B2* | 7/2003 | Lin et al. | ............... | 204/192.2 |
| 6,603,643 B2* | 8/2003 | Hoshiya et al. | ........ | 360/324.11 |
| 6,620,530 B1* | 9/2003 | Li et al. | ................... | 428/811.2 |
| 6,775,903 B2* | 8/2004 | Horng et al. | ............. | 29/603.14 |
| 6,822,838 B2* | 11/2004 | Lin et al. | ................. | 360/324.2 |
| 6,972,934 B2* | 12/2005 | Horng et al. | ............ | 360/324.11 |
| 7,126,848 B2* | 10/2006 | Nakamura et al. | .......... | 365/171 |
| 7,161,771 B2* | 1/2007 | Lin et al. | .................... | 360/314 |
| 2004/0012898 A1* | 1/2004 | Hasegawa | ............. | 360/324.11 |
| 2005/0061658 A1* | 3/2005 | Lin et al. | ................. | 204/192.2 |
| 2005/0073777 A1* | 4/2005 | Hasegawa et al. | .......... | 360/321 |
| 2006/0098354 A1* | 5/2006 | Parkin | ..................... | 360/324.2 |
| 2006/0162148 A1* | 7/2006 | Horng et al. | ............. | 29/603.08 |
| 2006/0168797 A1* | 8/2006 | Li et al. | ................... | 29/603.07 |
| 2007/0217082 A1* | 9/2007 | Lin | ........................ | 360/324.11 |
| 2009/0325319 A1* | 12/2009 | Horng et al. | .................. | 438/3 |

* cited by examiner

*Primary Examiner*—Jefferson Evans
(74) *Attorney, Agent, or Firm*—Zilka-Kotab, PC

(57) ABSTRACT

An anti-parallel pinned sensor is provided with a spacer that increases the anti-parallel coupling strength of the sensor. The anti-parallel pinned sensor is a GMR or TMR sensor having a pure ruthenium or ruthenium alloy spacer. The thickness of the spacer is less than 0.8 nm, preferably between 0.1 and 0.6 nm. The spacer is also annealed in a magnetic field that is 1.5 Tesla or higher, and preferably greater than 5 Tesla. This design yields unexpected results by more than tripling the pinning field over that of typical AP-pinned GMR and TMR sensors that utilize ruthenium spacers which are 0.8 nm thick and annealed in a relatively low magnetic field of approximately 1.3 Tesla.

11 Claims, 3 Drawing Sheets

US 7,848,064 B2

ENHANCED ANTI-PARALLEL-PINNED SENSOR USING THIN RUTHENIUM SPACER AND HIGH MAGNETIC FIELD ANNEALING

RELATED APPLICATIONS

This application is a Continuation of co-pending U.S. patent application Ser. No. 11/048,406 entitled ENHANCED ANTI-PARALLEL-PINNED SENSOR USING THIN RUTHENIUM SPACER AND HIGH MAGNETIC FIELD ANNEALING, filed on Feb. 1, 2005, now U.S. Pat. No. 7,408,747, which is incorporated herein by reference as if fully set forth herein.

BACKGROUND OF THE INVENTION

1. Technical Field

The present invention relates in general to and, in particular, to an improved system, method, and apparatus for improving the pinning strength of anti-parallel (AP) pinned giant magnetoresistive (GMR) and tunneling magnetoresistive (TMR) sensors using extra thin, ruthenium (Ru) alloy spacers that are annealed in a high magnetic field.

2. Description of the Related Art

A spin valve type giant magnetoresistive thin film used for a magnetic recording head of a hard disk drive has a multilayer film structure comprised of a plurality of layers or thin films. These layers include an antiferromagnetic layer, a fixed magnetization layer, a nonmagnetic conductive layer, and a free magnetization layer. In the multilayer film structure of the spin valve type giant magnetoresistive thin film, the nonmagnetic conductive layer is formed between the fixed magnetization layer and the free magnetization layer so that the two are isolated by the nonmagnetic conductive layer. Further, since the antiferromagnetic layer is made to adjoin the fixed magnetization layer, the magnetic moment of the fixed magnetization layer is fixed in one direction by the exchange coupling with the antiferromagnetic layer. On the other hand, the magnetic moment of the free magnetization layer is freely rotated in accordance with the external magnetic field.

The spin valve type giant magnetoresistive thin film generates the so-called "giant magnetoresistive effect," or the change of the electrical resistance due to the relative angle formed by the magnetic moment of the fixed magnetization layer and the magnetic moment of the free magnetization layer. The rate of change of the electrical resistance due to the giant magnetoresistive effect is called the "magnetoresistive ratio" (MR ratio). The MR ratio of a spin valve type giant magnetoresistive thin film is far higher than that of a conventional anisotropic magnetoresistive thin film.

There are three types of spin valve type giant magnetoresistive thin films. The first type is known as a "bottom type" and comprises, from a substrate side, a buffer layer, an antiferromagnetic layer, a fixed magnetization layer, a nonmagnetic conductive layer, a free magnetization layer, and a protective layer that are stacked in that order. The second type is known as a "top type" and comprises a substrate, a buffer layer, a free magnetization layer, a nonmagnetic conductive layer, a fixed magnetization layer, an antiferromagnetic layer, and a protective layer in that order. The third type is called a "dual type" and comprises a substrate, a buffer layer, a first antiferromagnetic layer, a first fixed magnetization layer, a first nonmagnetic conductive layer, a free magnetization layer, a second nonmagnetic conductive layer, a second fixed magnetization layer, a second antiferromagnetic layer, and a protective layer in that order.

There have been proposed thin films for replacing the single layers of the fixed magnetization layers with synthetic ferromagnetic structures having fixed magnetization layer elements, nonmagnetic layers, and fixed magnetization layer elements. Furthermore, the free magnetization layer also comes in single layer structures and multilayer structures. In free magnetization layers and fixed magnetization layers of multilayer structures, all the layers are magnetic films, but sometimes different magnetic films are stacked or a sandwich stricture interposing a nonmagnetic film therebetween is used.

The giant magnetoresistive effect of spin valve type giant magnetoresistive thin film is due to spin-dependent scattering of conductive electrons at the stacked interfaces of multilayer films. Therefore, to obtain a high MR ratio, cleanliness or flatness of the interfaces becomes important in the process of production of the spin valve film. Therefore, in the spin valve type giant magnetoresistive thin film, to achieve the cleanliness or flatness of the interfaces, the films are often formed continuously in the same vacuum chamber so that the intervals between formations of one layer and another become as short as possible.

Techniques for forming a film in vacuum include magnetron sputtering, ion beam sputtering, electron cyclotron resonance (ECR) sputtering, facing target sputtering, high frequency sputtering, electron beam evaporation, resistance heating evaporation, molecular beam epitaxy (MBE), etc.

To obtain a high MR ratio, the thickness of the nonmagnetic conductive layer should be small so as to suppress the flow of conductive electrons not contributing to the giant magnetoresistive effect (shunt effect). If the thickness of the nonmagnetic conductive layer is made small, however, the fixed magnetization layer and the free magnetization layer will end up coupling ferromagnetically through the nonmagnetic conductive layer. The interlayer coupling magnetic field between the fixed magnetization layer and the free magnetization layer should be small for practical use of the magnetic recording head of a hard disk drive. In the past, to reduce the interlayer coupling magnetic field, the thickness of the nonmagnetic conductive layer was set to 2.5 to 3.5 nm.

The technique of reducing the ferromagnetic coupling occurring between the fixed magnetization layer and the free magnetization layer by inserting a nano oxide layer of a size of not more than 1 nm into the fixed magnetization layer in the bottom type of spin valve film has been proposed. As a result, a relatively small interlayer coupling magnetic field is obtained and a high MR ratio is obtained even with a thin (2.0 to 2.5 nm) nonmagnetic conductive layer. That is, in the conventional spin valve type giant magnetoresistive thin film, the thickness of the nonmagnetic conductive layer was set thick (2.5 to 3.5 nm) to reduce the interlayer coupling magnetic field, but the problem arose of a flow of conductive electrons not contributing to the giant magnetoresistive effect (shunt effect) and the MR ratio ending up being reduced. Further, in the process of production of the above nano oxide layer, an oxidation step becomes necessary in the middle of formation of the fixed magnetization layer. An oxidation step is complicated and is poor in reproducibility. Thus, an improved solution would be desirable.

SUMMARY OF THE INVENTION

One embodiment of a system, method, and apparatus for increasing the anti-parallel coupling strength of an anti-parallel pinned sensor is disclosed. The present invention includes an anti-parallel pinned sensor, such as a GMR or TMR sensor, having a pure ruthenium or ruthenium alloy spacer. The thickness of the spacer is less than 0.8 nm, preferably between 0.1 and 0.6 nm. The spacer is also annealed in a magnetic field that is 1.5 Tesla or higher. In one embodiment, the magnetic field is 5 Tesla or more. The present invention yields unexpected results by more than tripling the pinning field over that of typical AP-pinned GMR and TMR sensors that utilize ruthenium spacers which are 0.8 nm thick and annealed in a relatively low magnetic field of approximately 1.3 Tesla.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 1:
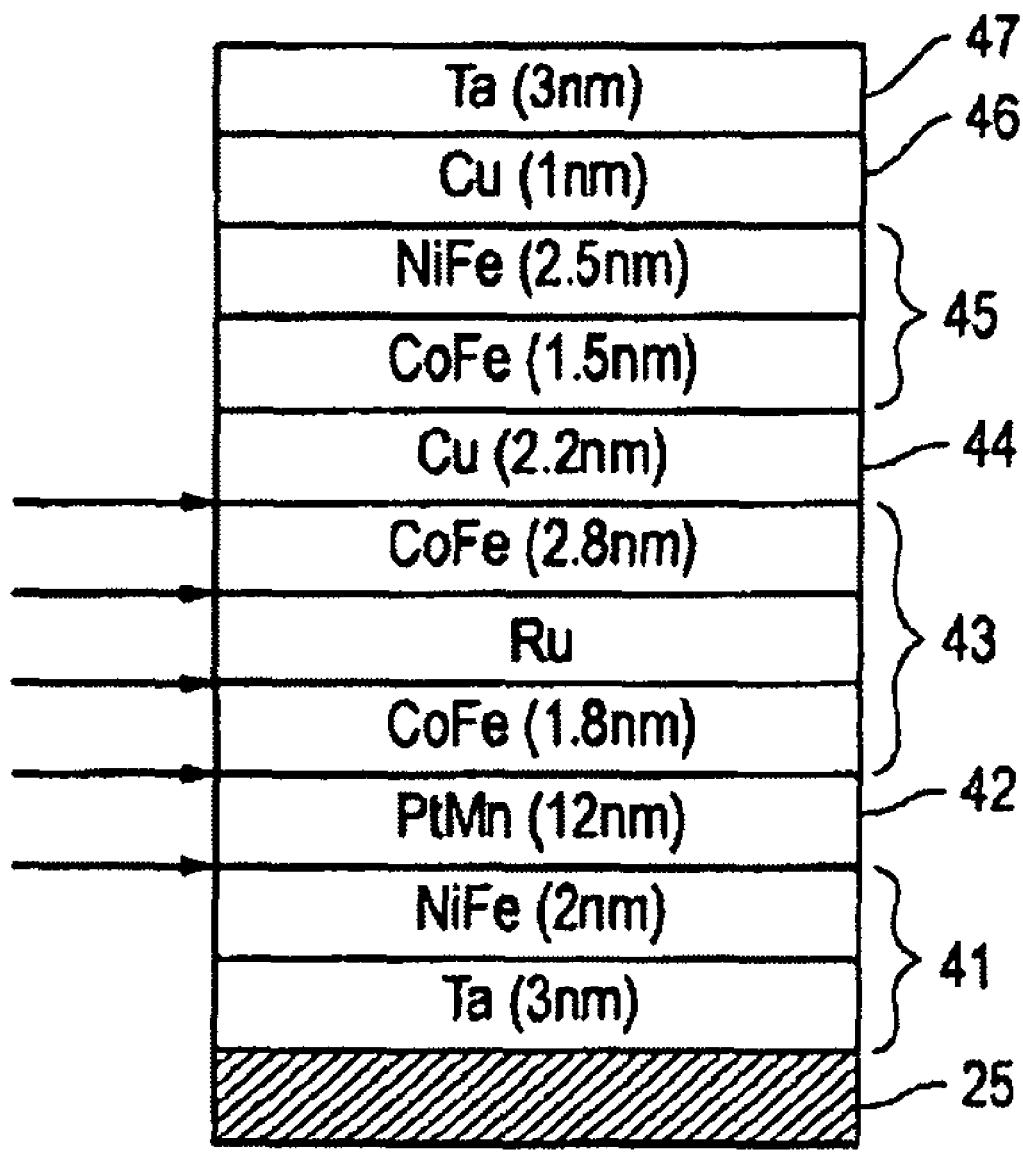
FIG. 1 is a schematic sectional view of a multilayer structure of a bottom type, spin valve type giant magnetoresistive thin film for a magnetic recording head in a disk drive.

Referring to FIG. 1, one embodiment of a multilayer structure of a bottom type of a spin valve type giant magnetoresistive (GMR) thin film of a multilayer film is shown. According to this embodiment of the multilayer structure, Ta (3 nm)/NiFe (2 nm)/PtMn (12 nm)/CoFe (1.8 nm)/Ru/CoFe (2.8 nm)/Cu (2.2 nm)/CoFe (1.5 nm)/NiFe (2.5 nm)/Cu (1 nm)/Ta (3 nm) are consecutively stacked in that order from the substrate 25 side. The numerical values given in parentheses in the layers are the thicknesses of the layers in units of nanometers (nm). One skilled in the art will recognize that these numerical values are given by way of example and for reference purposes for one embodiment of the present invention. The present invention is not limited to such values.

In one embodiment of the present invention, the Ru film or spacer is less than 0.8 nm thick, and preferably between the range of 0.1 and 0.6 nm. The Ru spacer is also annealed in a high magnetic field that is greater than 1.5 Tesla, and, in one embodiment, greater than 5 Tesla. In yet another embodiment, the spacer is annealed in a magnetic field from 5 to 10 Tesla.

In this multilayer structure, Ta (3 nm) and NiFe (2 nm) are the buffer layers 41, PtMn (12 nm) is the antiferromagnetic layer 42, CoFe (1.8 nm), Ru, and CoFe (2.8 nm) are the fixed magnetization layers (synthetic ferromagnetic structure) 43, Cu (2.2 nm) is the nonmagnetic conductive layer 44, CoFe (1.5 nm) and NiFe (2.5 nm) are the free magnetization layers 45, Cu (nm) is a spin filter 46, and Ta (3 nm) is the protective layer 47. These layers may be formed in one or more film forming chambers. Plasma treatment is suitably performed in the film forming steps. When performing plasma treatment, the film formation is temporarily interrupted at the desired interface, the substrate 25 is transported to a plasma treatment chamber for plasma treatment.

Figure 2:
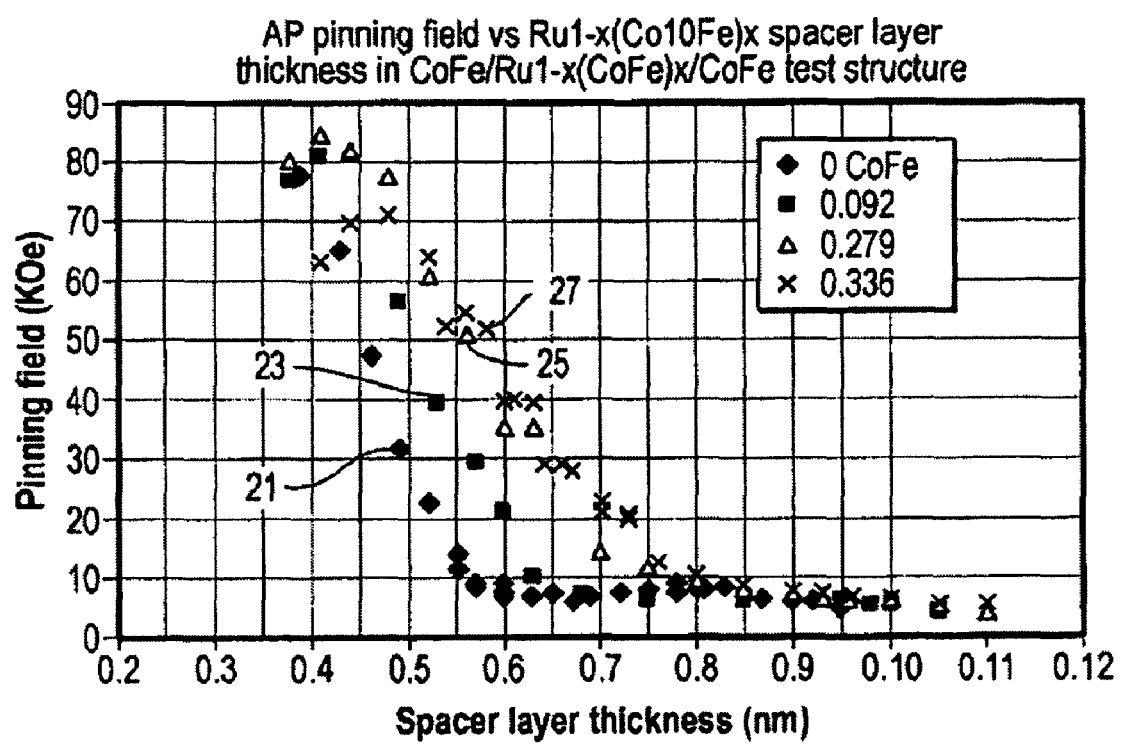
FIG. 2 are plots of spacer layer thicknesses versus pinning field strength for various embodiments of a sensor constructed in accordance with the present invention.

Referring now to FIG. 2, plots of spacer layer thicknesses versus pinning field strength for four embodiments of a sensor (e.g., a magnetic sensor) constructed in accordance with the present invention are shown. Plot 21 depicts performance for a pure ruthenium spacer, plot 23 is that of a ruthenium alloy having 9.2% CoFe, plot 25 is that of a ruthenium alloy having 27.9% CoFe, and plot 27 is that of a ruthenium alloy having 33.6% CoFe. The strength of the pinning field clearly increases for each of these embodiments at spacer thicknesses that are less than 0.8 nm, and dramatically increases at thicknesses of less than 0.6 nm.

Figure 3:
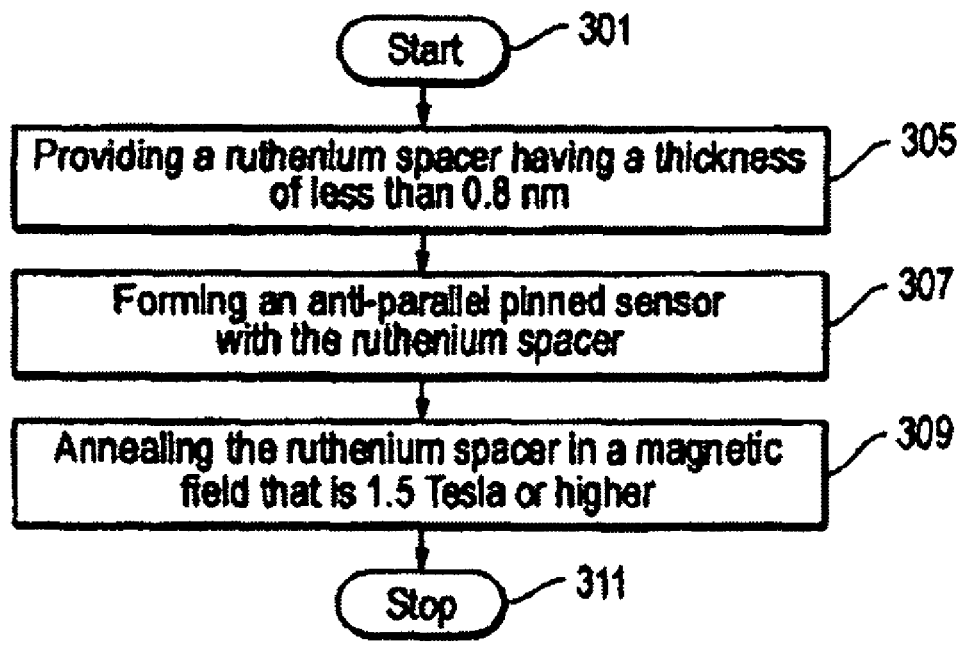
FIG. 3 is a high level flow diagram of a method in accordance with the present invention.

Referring now to FIG. 3, a simplified, high level flow chart depicting one embodiment of a method of the present invention is shown. For example, the method starts as illustrated at step 301, and increases the anti-parallel coupling strength of an anti-parallel pinned sensor. The method comprises providing a ruthenium spacer having a thickness of less than 0.8 nm, as depicted at step 303, forming an anti-parallel pinned sensor with the ruthenium spacer (step 305), and annealing the ruthenium spacer in a magnetic field that is 1.5 Tesla or higher (step 307). The anti-parallel pinned sensor may be selected from the group consisting of GMR and TMR sensors. The ruthenium spacer may comprise pure ruthenium, or a ruthenium alloy formed with, for example, Co, Fe, CoFe, and/or other similar types of metals. In one embodiment, the thickness of the ruthenium spacer is between 0.1 and 0.6 nm and die magnetic field is greater than 5 Tesla.

Figure 4:
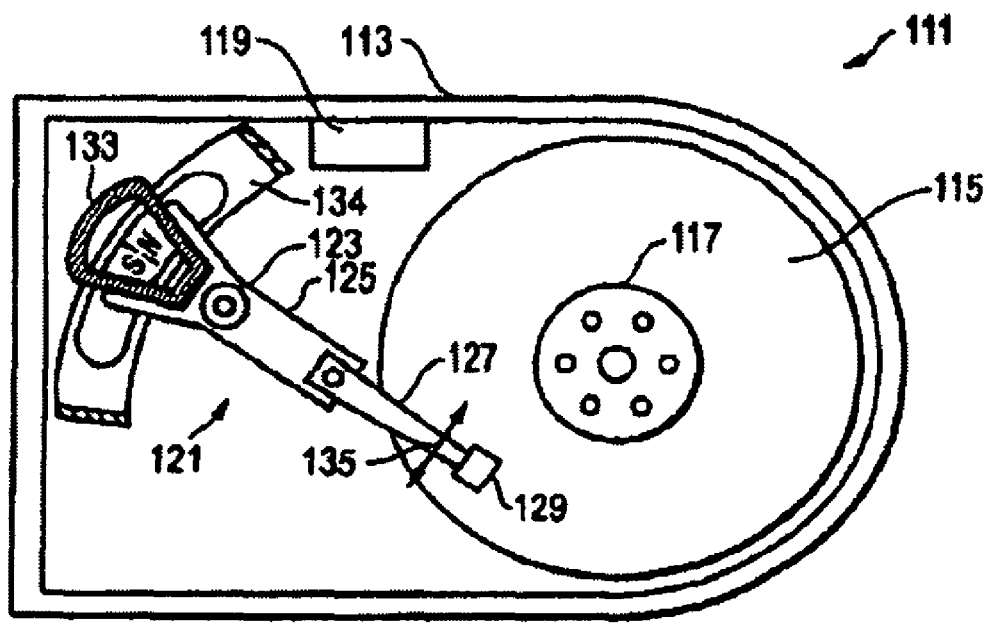
FIG. 4 is a schematic drawing of a hard disk drive constructed in accordance with the present invention.

Referring now to FIG. 4, one embodiment of the present invention is provided in a magnetic hard disk file or drive 111 for a computer system. Drive 111 has an outer housing or base 113 containing at least one magnetic disk 115. Disk 115 is rotated by a spindle motor assembly having a central drive hub 117. An actuator 121 comprises a plurality of parallel actuator arms 125 (one shown) in the form of a comb that is pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered load beam and suspension 127. A magnetic read/write transducer or head (equipped with the sensor described above) is mounted on a slider 129 and secured to a flexure that is flexibly mounted to each suspension 127. The read/write heads magnetically read data from and/or magnetically write data to disk 115. The level of integration called the head gimbal assembly is head and the slider 129, which are mounted on suspension 127. The slider 129 is usually bonded to the end of suspension 127. The head is typically pico size (approximately 1250×1000×300 microns) and formed from ceramic or intermetallic materials. The head also may be femto size (approximately 850×700×230 microns) and is pre-loaded against the surface of disk 115 (in the range two to ten grams) by suspension 127.

Suspensions 127 have a spring-like quality which biases or urges the air bearing surface of the slider 129 against the disk 115 to enable the creation of the air bearing film between the slider 129 and disk surface. A voice coil 133 housed within a conventional voice coil motor magnet assembly 134 (top pole not shown) is also mounted to arms 125 opposite the head gimbal assemblies. Movement of the actuator 121 (indicated by arrow 135) by controller 119 moves the head gimbal assemblies radially across tracks on the disk 115 until the heads settle on their respective target tracks. The head gimbal assemblies operate in a conventional manner and always move in unison with one another, unless drive 111 uses multiple independent actuators (not shown) wherein the arms can move independently of one another.

While the invention has been shown or described in only some of its forms, it should be apparent to those skilled in the art that it is not so limited, but is susceptible to various changes without departing from the scope of the invention.

What is claimed is:

1. A method of increasing the coupling strength of a sensor, the method comprising:
    (a) providing a ruthenium spacer having a thickness of less than 0.8 nm;
    (b) forming a sensor with the ruthenium spacer; and
    (c) annealing the ruthenium spacer in a magnetic field that is greater than 2.5 Tesla.
2. The method of claim 1, wherein the sensor is an anti-parallel pinned sensor.
3. The method of claim 1, wherein the sensor is selected from the group consisting of GMR and TMR sensors.
4. The method of claim 1, wherein the ruthenium spacer is a ruthenium alloy.
5. The method of claim 1, wherein the ruthenium spacer is pure ruthenium.
6. The method of claim 1, wherein the thickness of the ruthenium spacer is between 0.1 and 0.6 nm.
7. A method of increasing the anti-parallel coupling strength of an anti-parallel pinned sensor, the method comprising:
    (a) providing a ruthenium spacer having a thickness of less than 0.8 nm;
    (b) forming an anti-parallel pinned sensor with the ruthenium spacer; and
    (c) annealing the ruthenium spacer in a magnetic field that is greater than 2.5 Tesla.
8. The method of claim 7, wherein the anti-parallel pinned sensor is selected from the group consisting of GMR and TMR sensors.
9. The method of claim 7, wherein the ruthenium spacer is a ruthenium alloy.
10. The method of claim 7, wherein the ruthenium spacer is pure ruthenium.
11. The method of claim 7 wherein the thickness of the ruthenium spacer is between 0.1 and 0.6 nm.

* * * * *